United States Patent
Juen

(10) Patent No.: US 6,617,767 B2
(45) Date of Patent: Sep. 9, 2003

(54) THERMAL DISPERSING SYSTEM OF A PLASMA DISPLAY DEVICE

(75) Inventor: Jae Hong Juen, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/967,990

(22) Filed: Oct. 2, 2001

(65) Prior Publication Data

US 2002/0043916 A1 Apr. 18, 2002

(30) Foreign Application Priority Data

Oct. 16, 2000 (KR) ........................................ 2000-60768

(51) Int. Cl.[7] .................... H01J 19/74; H01J 17/49; G09F 9/313
(52) U.S. Cl. ...................... 313/44; 313/40; 313/46; 313/493; 313/582; 445/24; 445/25; 362/294
(58) Field of Search .............................. 313/40, 44, 46, 313/47, 493, 573, 582, 634, 45; 445/25, 24; 362/294; 248/689, 694; 209/409

(56) References Cited

U.S. PATENT DOCUMENTS 5,971,566 A   10/1999  Tani et al. ................... 362/294
6,346,334 B1 * 2/2002  Kamitani ..................... 428/521
6,522,069 B1 * 2/2003  Hong et al. .................. 313/582

FOREIGN PATENT DOCUMENTS

EP    0945888 A2    9/1999    ............ H01J/17/28
JP    11065484 A  * 3/1999    ............ G09F/9/313

* cited by examiner

Primary Examiner—Ashok Patel
Assistant Examiner—Sikha Roy
(74) Attorney, Agent, or Firm—Fleshner & Kim, LLP

(57) ABSTRACT

Disclosed is a heat dissipating system of a plasma display device. The heat dissipating system of the plasma display device includes a plasma display panel and a main frame, which is arranged in parallel to the plasma display panel and radiates heat generated in the plasma display panel. The main frame has at least one groove part, and the plasma display panel and a first support inserted through the groove part are adhered by adhesive means. The first support and the main frame are fixedly supported by a second support. As a result, the present invention has advantages of achieving high heat dissipating effect by making an interval between the main frame and the plasma display panel possible to be reduced or almost eliminated, and of achieving an easy detachment between the main frame and the plasma display panel.

4 Claims, 4 Drawing Sheets

[FIG. 1]
Prior Art
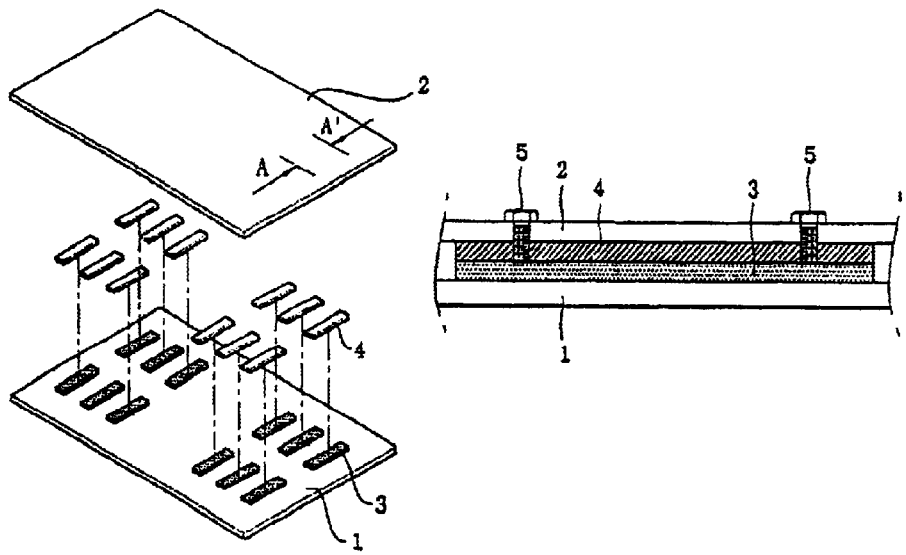
[FIG.2]
Prior Art
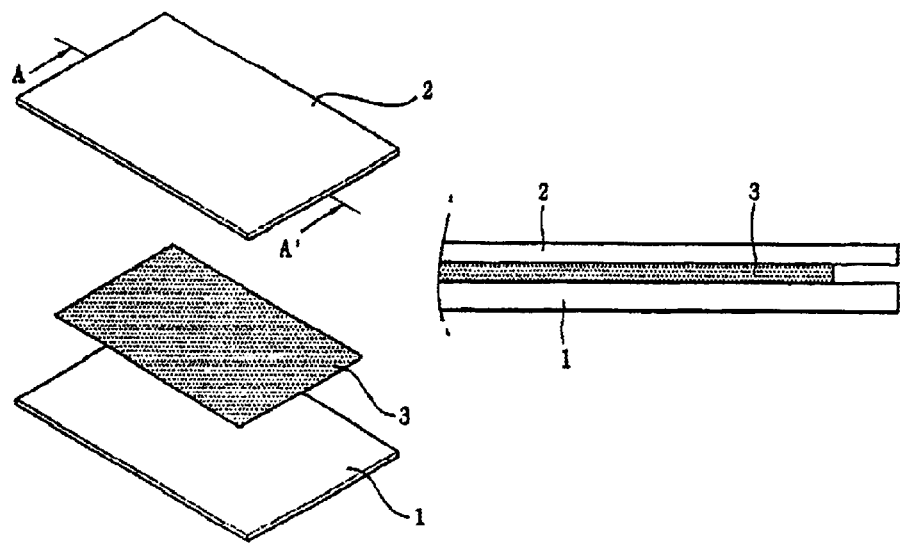

[FIG. 3]
Prior Art
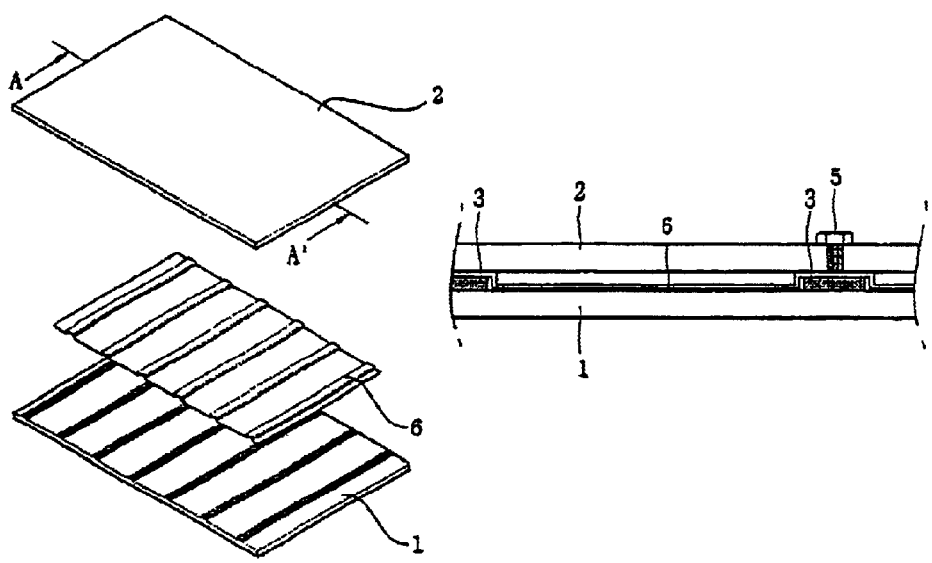

[FIG. 4]
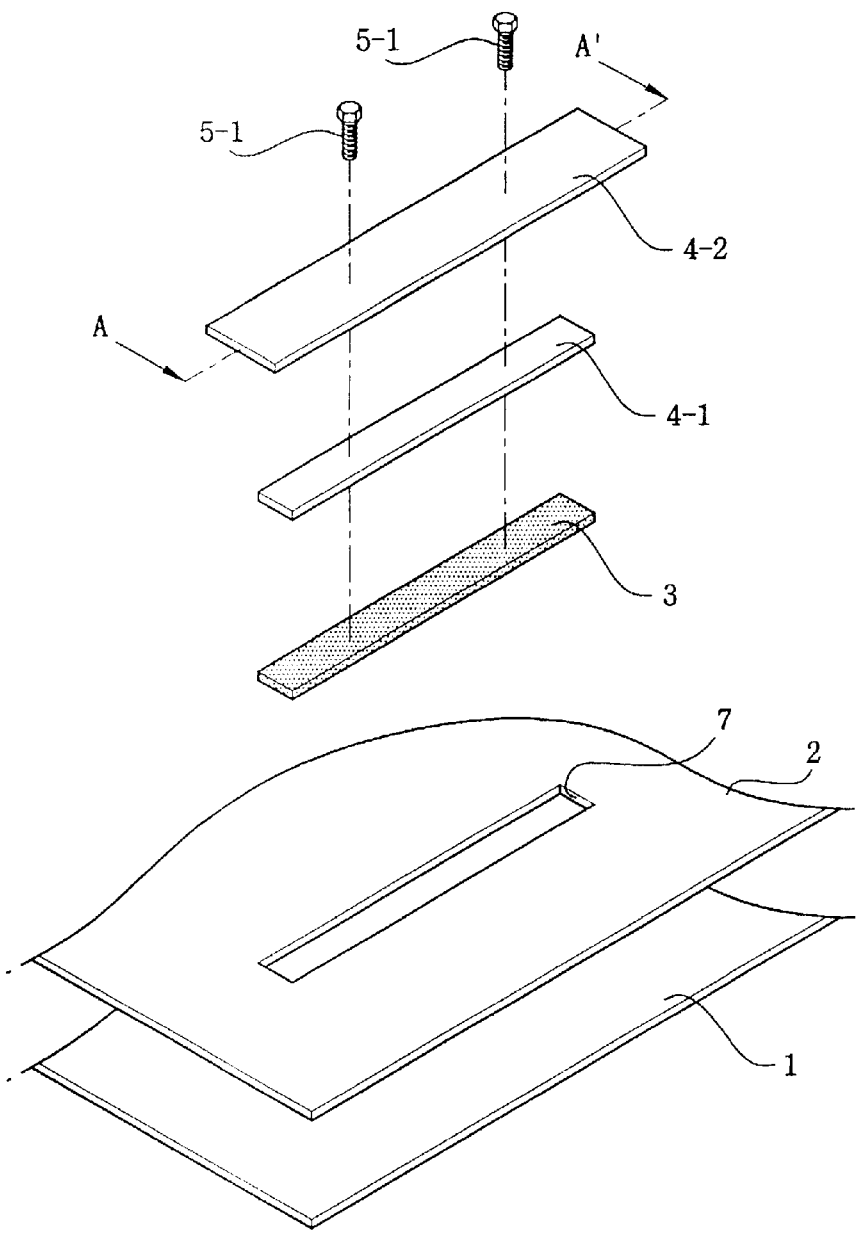

[FIG. 5]
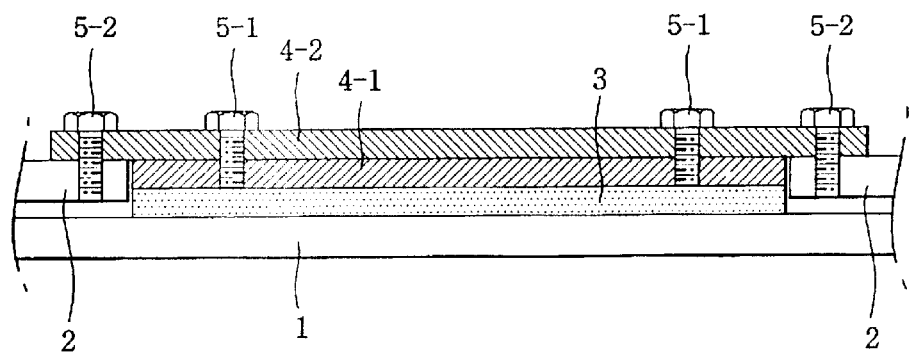

THERMAL DISPERSING SYSTEM OF A PLASMA DISPLAY DEVICE

BACKGROUND OF THE INVENTION

1. Field of the Invention

The present invention relates to a heat dissipating system of a plasma display device, and more particularly, to a heat dissipating system of a plasma display device capable of achieving superior radiation efficiency and easily detaching a main frame from a plasma display panel.

Recently, a plasma display device which displays a picture by using a gas discharge phenomenon has greatly attracted the attention of many people as a display device, e.g., a wall-mounted television, since it has advantages in providing a larger screen, a wider viewing angle, lighter weight and thinner thickness.

2. Background of the Related Art

In general, a plasma display device includes a front plate and a rear plate which are coupled in parallel with a predetermined gap between them, and a barrier rib for dividing a discharge cell in the predetermined gap wherein the inside of the barrier rib is coated with a fluorescent material and filled with a discharged gas. Further, a plurality of common sustaining electrodes and a plurality of scanning/sustaining electrodes are alternately arranged in parallel on the front plate. A plurality of data electrodes is formed on the rear plate in parallel in a direction approximately orthogonal to the common sustaining electrodes and the scanning/sustaining electrodes. A signal voltage is applied to the electrodes arranged in the matrix pattern so as to discharge the gas within the discharge cell, and the fluorescent material is excited and generates light through a secondary electron generated in the gas so as to display an image.

Since discharge should be performed several times in case that the plasma display panel operated as above displays the image at a high brightness, a considerable amount of heat is generated. As a result, there are caused problems that a driving circuit for driving a display panel is deteriorated in reliability and the plasma display panel is also deteriorated in performance and characteristic. In addition, when the plasma display panel is displayed according to an image display signal, if a high brightness is displayed in some portions, a temperature difference is more increased than low brightness portions around. In consequence, a glass plate comprised in the plasma display panel suffers a local distortion, sometimes leading to breakage.

In order to solve the aforementioned problems, there has been used a method in which a radiation fan is installed within a chassis. However, the method is found to cause noise and high power consumption. Therefore, attempts are now being directed to developing another method.

FIG. 1 illustrates a heat dissipating system of the conventional plasma display device. Referring to the figure, a plurality of supports 4 are fixed on a rear surface of a plasma panel 1 by using a double-sided adhesive tape 3, and a main frame 2 is coupled with the supports 4 by using a coupling mechanism 5, such as screws. This method has an advantage of easily fixing and detaching the plasma display panel 1 and the main frame 2. However, a gap between the panel 1 and the main frame 2 becomes larger and an air flowing layer is increased, thereby deteriorating heat radiation efficiency.

FIG. 2 illustrates another heat dissipating system of the conventional plasma display device (Korean Publication No. 1998-11613). A main frame 2 is fixed on the plasma display panel by using a double-sided adhesive tape 3 having high heat conductivity without additional supports. This structure shows excellent heat radiation effect. However, it has disadvantages that the plasma display panel cannot be easily fixed on or detached from the main frame 2 when the plasma display panel has something wrong or is damaged, and the main frame 2 is difficult to be coupled since the plasma display panel 1 is materialized of glass.

FIG. 3 illustrates still another heat dissipating system of the conventional plasma display device (Korean Publication No. 1999-76550). A concavo-convex plate 6 is interposed between a main frame 2 and a plasma display panel 1. The concavo-convex plate 6 is fixed on the plasma display panel by putting adhesive means, e.g., a both-sided tape, into a concave part of the concavo-convex plate 6, a convex part of the concavo-convex plate 6 is directly contacted with a surface of the plasma display panel, and the main frame 2 is fixedly supported on the concavo-convex plate 6. The heat dissipating system constructed as above has an advantage of being easily detached and having superior heat dissipation efficiency. However, the following problems arise: material costs and manufacturing costs are increased since the concavo-convex plate 6 is additionally needed and the concavo-convex plate should have heavy thickness to fixedly support the main frame 2 thereon, and the concavo-convex plate 6 should be discarded along with the plasma display panel when the plasma display panel needs to be replaced.

SUMMARY OF THE INVENTION

Accordingly, the present invention is directed to a heat dissipating system of a plasma display device that substantially obviates one or more problems due to limitations and disadvantages of the related art.

An object of the present invention is to provide a heat dissipating system of a plasma display device, which can easily detach a main frame from a plasma panel, be manufactured at low costs and ensure excellent heat radiation efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a heat dissipating system of a plasma display device, the system including a plasma display panel and a main frame which is arranged in parallel to the plasma display panel and dissipates heat generated in the plasma display panel, wherein the main frame has at least one groove part, and the plasma display panel and a first support inserted through the groove part are fixed together by adhesive means; and wherein the first support and the main frame 2 is fixedly supported by a second support.

Further, the first support is the same as the main frame in thickness or thinner than the main frame, the second support is larger than the groove part in area, and the first support and the main frame are fixedly supported by employing coupling means to only the first support.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings;

FIG. 1 illustrates a heat dissipating system of the conventional plasma display device;

FIG. 2 illustrates another heat dissipating system of the conventional plasma display device;

FIG. 3 illustrates still another heat dissipating system of the conventional display device;

FIG. 4 illustrates an exploded cross view of a heat dissipating system of a plasma display device according to the present invention; and FIG. 5 illustrates a sectional view taken along a cut line A—A of FIG. 4.

DETAILED DESCRIPTION OF THE PREFERRED EMBODIMENT

Reference will now be made in detail to the preferred embodiments of the present invention, examples of which are illustrated in the accompanying drawings.

FIG. 4 illustrates an exploded cross view of an essential part of a heat dissipating system of a plasma display device according to the present invention. A main frame 2 having a groove part of predetermined size thereon is attached on a surface of a plasma display panel 1. A first support 4-1 is adhesively secured through the groove part 7 by using adhesive means, e.g., a double-sided adhesive tape. Here, the main frame 2 is made of lightweight aluminum having excellent heat conductivity. The first support 4-1 is manufactured to have a size suitable for being inserted into the groove part 7. In particular, thickness of the first support 4-1 is adjustable in consideration of thickness of the double-sided adhesive tape and the main frame. An interval between the main frame and the plasma display panel is accordingly adjustable. Here, it is desirable that the first support 4-1 is the same as the main frame in thickness or thinner than the main frame.

In this way, since the main frame 2 is not fixed on the plasma display panel, the main frame 2 and the first support 4-1 which is fixed on the plasma display panel 1 are coupled by using a second support 4-2. Here, the coupling process is performed in a manner that the second support 4-2 and the first support 4-1 are coupled by using coupling means 5-1, e.g., screws, and the second support 4-2 and the main frame 2 are coupled by using another coupling means 5-2 as shown in FIG. 5.

However, if there is used the second support 4-2 which is larger than the groove part 7 in area in a condition that the first support 4-1 is firmly inserted into the groove part 7, the second support 4-2 is not necessarily coupled with the main frame 2 by using the coupling means 5-2, but only the main frame 2 and the first support 4-1 fixed on the plasma display panel 1 need to be coupled with each other. Further, even though the screws are used as the coupling means 5-1 and the double-sided adhesive tape is used as the adhesive means in the above explanation, they are only exemplary means and various types of means may be used.

FIG. 5 illustrates a sectional view of an essential part of the heat dissipating system of the plasma display device according to the present invention. The plasma display panel 1 according to the present invention has high heat dissipation effect since the interval between the main frame and the plasma display panel is adjustable by closely adhering the main frame 2 and the first support 4-1 by means of the double-sided adhesive tape or adjusting the thickness of the first support 4-1. Additionally, the coupled main frame 2 and the plasma display panel 1 can be detached by only removing the coupling means 5-2, e.g., screws. At that time, the first support 4-1 is fixed and stayed on the plasma display panel by the double-sided adhesive tape. When there is a necessity to discard the plasma display panel, only the First support 4-1 needs to be removed along with the plasma display panel without largely increasing costs.

As stated above, the presenting invention has an advantage of ensuring high heat dissipation effect by making the interval between the main frame and the plasma display panel possible to be reduced or almost eliminated.

The present invention has a further advantage of easily detaching the main frame from the plasma display panel.

The present invention has yet another advantage of achieving economical effect by removing only the first support along with the plasma display panel when the plasma display panel needs to replaced.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A heat dissipating system of a plasma display device, the system comprising a plasma display panel and a main frame which is arranged in parallel to the plasma display panel and radiates heat generated in the plasma display panel, wherein the main frame has at least one groove part, and a first support inserted through the groove part and the plasma display panel are adhered together by adhesive means; and wherein the first support and the main frame are fixedly supported by a second support.

2. The system of claim 1, wherein the first support is the same as the main frame in thickness or thinner than the main frame.

3. The system of claim 1, wherein the second support is larger than the groove part in area, and the second support is coupled with the first support by coupling means such that the first support and the main frame are fixedly supported.

4. The system of claim 3, wherein said second support is further coupled with the main frame by another coupling means.

* * * * *